(12) United States Patent  (10) Patent No.: US 10,700,118 B2
Huang  (45) Date of Patent: Jun. 30, 2020

(54) MULTISPECTRAL IMAGING DEVICE

(71) Applicant: EXPANTRUM OPTOELECTRONICS, Shanghai (CN)

(72) Inventor: Zhongshou Huang, Shanghai (CN)

( * ) Notice: Subject to any disclaimer, the term of this patent is extended or adjusted under 35 U.S.C. 154(b) by 0 days.

(21) Appl. No.: 16/143,397

(22) Filed: Sep. 26, 2018

(65) Prior Publication Data
US 2019/0096949 A1  Mar. 28, 2019

(30) Foreign Application Priority Data

Sep. 26, 2017 (CN) .......................... 2017 1 0881441

(51) Int. Cl.
| | | |
|---|---|---|
| *H01L 27/146* | (2006.01) | |
| *H01L 27/30* | (2006.01) | |
| *H01L 31/0376* | (2006.01) | |
| *H01L 31/0224* | (2006.01) | |
| *H01L 27/28* | (2006.01) | |

(Continued)

(52) U.S. Cl.
CPC .... *H01L 27/14652* (2013.01); *H01L 27/1461* (2013.01); *H01L 27/14612* (2013.01); *H01L 27/14645* (2013.01); *H01L 27/14649* (2013.01); *H01L 27/14665* (2013.01); *H01L 27/28* (2013.01); *H01L 27/307* (2013.01); *H01L 31/0272* (2013.01); *H01L 31/022408* (2013.01); *H01L 31/022466* (2013.01); *H01L 31/0328* (2013.01); *H01L 31/03762* (2013.01); *H01L 31/1013* (2013.01); *H01L 27/14621* (2013.01); *H01L 27/14623* (2013.01);

(Continued)

(58) Field of Classification Search
None
See application file for complete search history.

(56) References Cited

U.S. PATENT DOCUMENTS

| | | | | |
|---|---|---|---|---|
| 5,453,611 A | * | 9/1995 | Oozu | ................ H01L 27/14621 250/208.1 |
| 5,873,003 A | * | 2/1999 | Inoue | ..................... G02B 7/287 257/E27.136 |

(Continued)

OTHER PUBLICATIONS

The article entitled "Photodiode" available at https://www.physics-and-radio-electronics.com/electronic-devices-and-circuits/semiconductor-diodes/photodiodesymboltypes.html.*

*Primary Examiner* — Erik Kielin (57) ABSTRACT

A multispectral imaging device comprises a first photoelectric conversion module and a second photoelectric conversion module. The first photoelectric conversion module further includes a first photoelectric conversion layer located between a first conducting layer and a second conducting layer. The first conducting layer, coupled to a first constant potential, is configured to allow visible light and infrared light to pass through. The first photoelectric conversion layer is configured to convert the visible light into a first electrical signal. The second photoelectric conversion module, formed on a silicon substrate, is configured to receive the infrared light coming from the first photoelectric conversion module. The second photoelectric conversion layer located between a third conducting layer and a fourth conducting layer, wherein the third conducting layer is configured to allow the infrared light passing through, the second photoelectric conversion layer is configured to convert the infrared light into a second electrical signal.

10 Claims, 11 Drawing Sheets

(51) Int. Cl.
H01L 31/101 (2006.01)
H01L 31/0272 (2006.01)
H01L 31/0328 (2006.01)

(52) U.S. Cl.
CPC .. *H01L 27/14629* (2013.01); *H01L 27/14636* (2013.01); *H01L 27/14638* (2013.01)

(56) References Cited

U.S. PATENT DOCUMENTS

| | | | |
|---|---|---|---|
| 2013/0099343 A1* | 4/2013 | Toshikiyo | H01L 27/14625 257/432 |
| 2016/0037117 A1* | 2/2016 | Ono | H04N 5/2173 348/308 |
| 2019/0189696 A1* | 6/2019 | Yamaguchi | H01L 27/146 |

* cited by examiner

MULTISPECTRAL IMAGING DEVICE

CROSS REFERENCE

This application is based upon and claims the benefit of priority of Chinese Patent Applications No. 201710881441.0, filed on Sep. 26, 2017, the entire contents thereof are incorporated herein by reference.

TECHNICAL FIELD

The present disclosure relates to the field of photoelectric technology, specifically to an imaging device including functions of amplifying output signals of a pixel circuit and increasing photoelectric conversion voltage.

BACKGROUND

Infrared cameras are widely used in medical image diagnosis, biometrics, night vision, auto-driving, and machine vision. In many applications, live images of an object in both visible light and infrared light, are required and referred each other or aligned each other pixel to pixel to better understand the space structure and various characteristics of the object. For this purpose, multispectral imaging systems with dual-camera, capable of capturing visible light image and infrared light image separately have been developed. However, the dual-camera system has drawbacks such as bulky, high cost, and complexity in aligning two images acquired in separated optical axis.

It is therefore the primary object of this disclosure to realize a multispectral imaging device capable of capturing visible light (color or black-white) and infrared light in a compact format.

SUMMARY

In one embodiment of the present disclosure, a multispectral imaging device comprising a first photoelectric conversion module and a second photoelectric conversion module. The first photoelectric conversion module includes a first photoelectric conversion layer located between a first conducting layer and a second conducting layer, wherein the first conducting layer, coupled to a first constant potential, is configured to allow visible light and infrared light passing through, the first photoelectric conversion layer is configured to convert the visible light into a first electrical signal, and the second conducting layer, coupled to a first pixel circuit, is configured to allow the infrared light passing through.

The second photoelectric conversion module includes a second photoelectric conversion layer, formed in a silicon substrate, configured to convert the infrared light passing through the first photoelectric conversion module into a second electrical signal. The second photoelectric conversion layer is located between a third conducting layer and a fourth conducting layer, wherein the third conducting layer is configured to allow the infrared light passing through. A second pixel circuit coupled to the second photoelectric conversion module or the fourth conducting layer.

BRIEF DESCRIPTION OF THE DRAWINGS

Embodiments of the present disclosure will be described, by way of example only, with reference to the accompanying schematic drawings in which corresponding reference symbols indicate corresponding parts, and in which.

DETAILED DESCRIPTION

In the following, the technical contents of the present disclosure will be described with reference to the figures and embodiments. Same reference signs in the figures refer to same or similar structures, so repeated description of them will be omitted. The concept and its realizations of the present disclosure can be implemented in a plurality of forms, and should not be understood to be limited to the embodiments described hereafter. In contrary, these embodiments are provided to make the present disclosure more comprehensive and understandable, and so the conception of the embodiments can be conveyed to the technicians in the art fully.

The features, structures or characteristics described can be combined in any appropriate way in one or more embodiments. In the description below, many specific details are provided to explain the embodiments of the present disclosure fully. However, the technicians in the art should realize that, without one or more of the specific details, or adopting other methods, components, materials etc., the technical proposal of the present disclosure can still be realized. In certain conditions, structures, materials or operations well known are not shown or described in detail so as not to obfuscate the present disclosure.

Figure 1:
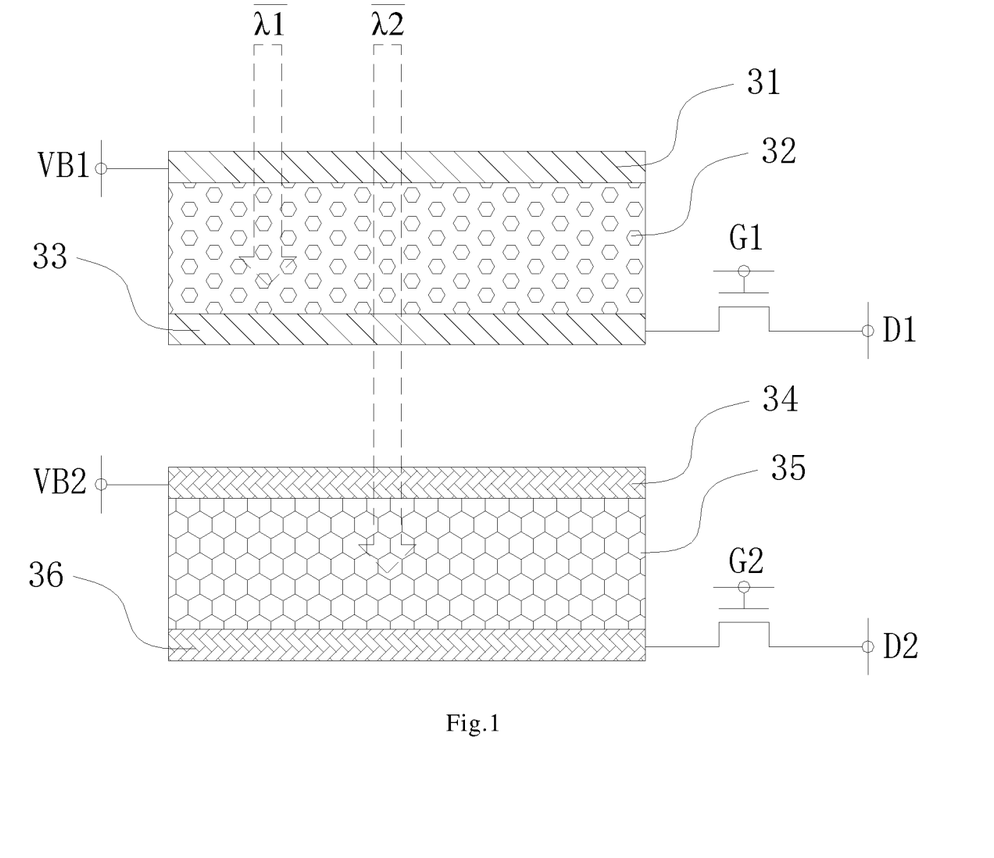
FIG. 1 shows a schematic view of a multispectral imaging device of one embodiment of the present disclosure.

FIG. 1 shows a schematic view of one embodiment of the present disclosure comprising a first photoelectric conversion module and a second photoelectric conversion module. As shown in FIG. 1, $\lambda_1$ is the wavelength of visible light beam and $\lambda_2$ is the wavelength of infrared light beam. In this embodiment, the first photoelectric conversion module includes a first electrode 31, a first photoelectric conversion layer 32, a second electrode 33 and a first pixel circuit simplified as a transistor G1 and connection to data line D1 (a first signal output line). The first electrode 31, coupled to a first constant potential VB1, is configured to allow the visible light $\lambda_1$ and the infrared light $\lambda_2$ passing through. The first photoelectric conversion layer 32, located between the first electrode 31 and the second electrode 33, is configured to convert the visible light into a first electrical signal and allow the infrared light $\lambda_2$ passing through. The second electrode 33, coupled to the first pixel circuit, is configured to allow the infrared light $\lambda_2$ to passing through.

In this embodiment, the second photoelectric conversion module further includes a third electrode 34, a second photoelectric conversion layer 35, a fourth electrode 36 and the second pixel circuit simplified as a transistor G2 and connection to data line D2 (a second signal output line). The third electrode 34, coupled to a second constant potential VB2, is configured to allow the infrared light passing through. The fourth electrode 36 is coupled to the second pixel circuit. The second photoelectric conversion layer 35, located between the third electrode 34 and the fourth electrode 36, is configured to convert the infrared light into a second electrical signal.

As shown in FIG. 1, the third electrode 34, coupled to the constant potential VB2, serves as electrostatic shielding to prevent interferences of electric field from electrode 33 to electrode 36.

As one of the varieties of this embodiment, the second output transistor G2 is configured to pick up signal directly from the second photoelectric conversion layer 35, while the fourth electrode 36 is then biased to a constant potential or kept in electric floating status.

Figure 2:
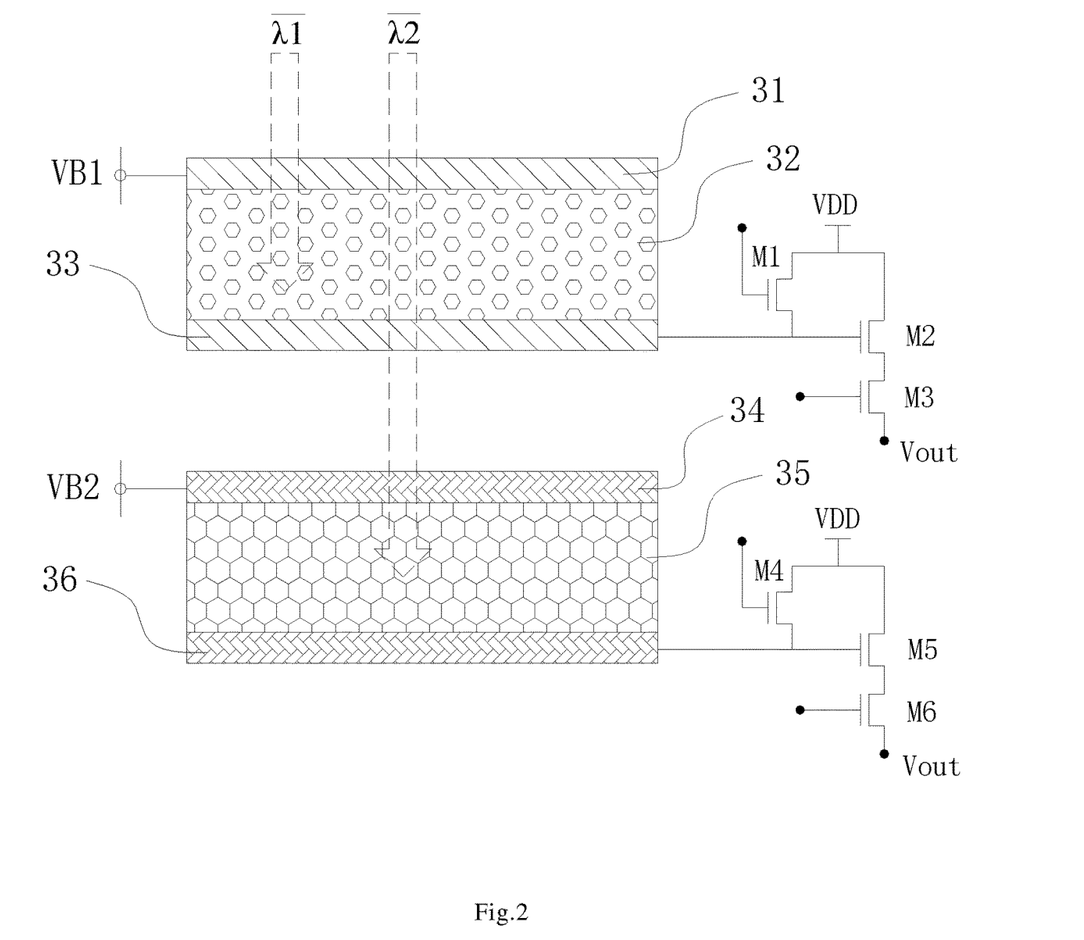
FIG. 2 shows a schematic view of a multispectral imaging device of one embodiment of the present disclosure.

The second embodiment is shown in FIG. 2, similar to the embodiment FIG. 1, but the first pixel circuit and the second pixel circuit include active pixel sensors (APS). The first pixel circuit includes a first reset transistor M1, a first amplifying transistor M2, and the first output transistor M3. The second pixel circuit includes a second reset transistor M4, a second amplifying transistor M5, and the second output transistor M6.

As in a conversional APS circuit, the gate of the amplifying transistor is coupled to a floating diffusion or electrode where photoelectric charges are collected, the reset transistor is configured to reset periodically the potential of the amplifying transistor gate. The output transistor serves as a switch to periodically output amplified signal current or voltage to external circuitry.

Figure 3:
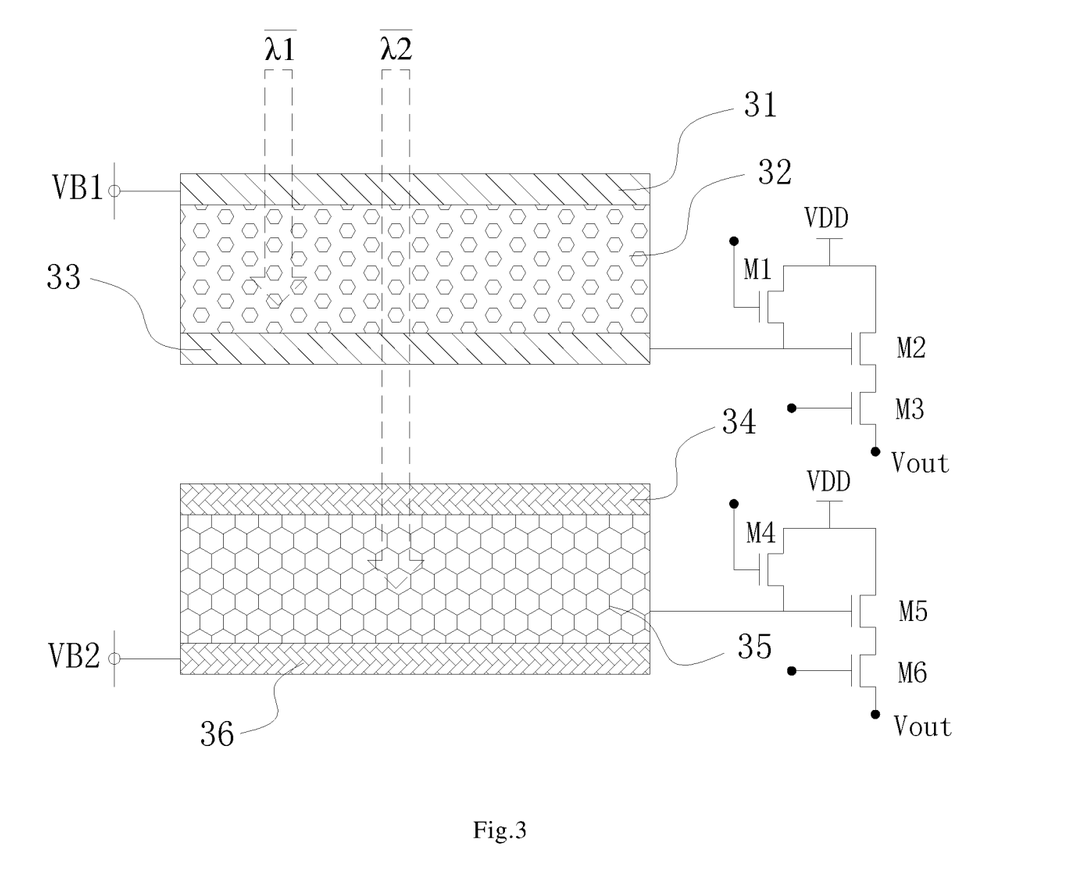
FIG. 3 shows a schematic view of a multispectral imaging device of one embodiment of the present disclosure.

Embodiment shown in FIG. 3, comparing with the embodiment in FIG. 2, has different arrangement in where to apply the bias voltage and where to pick up the signal in the second photoelectric conversion module. A constant potential VB2 is applied to the fourth electrode 36, while the gate of the amplifying transistor M5 is coupled to the second photoelectric conversion layer 35 directly or the third electrode 34 (not shown in FIG. 3). Since the bias VB2 can be applied directly on silicon wafer bottom, the arrangement proposed in the embodiment creates some advantages in manufacture process and device performance. The third electrode 34, in this embodiment, is kept electrically floating or coupled to a constant potential. A biased electrode 34 provides an electrostatic shielding between the gate of the amplifying transistor M2 and the gate of the amplifying transistor M5, effectively preventing interference between visible light image and infrared image.

Figure 4:
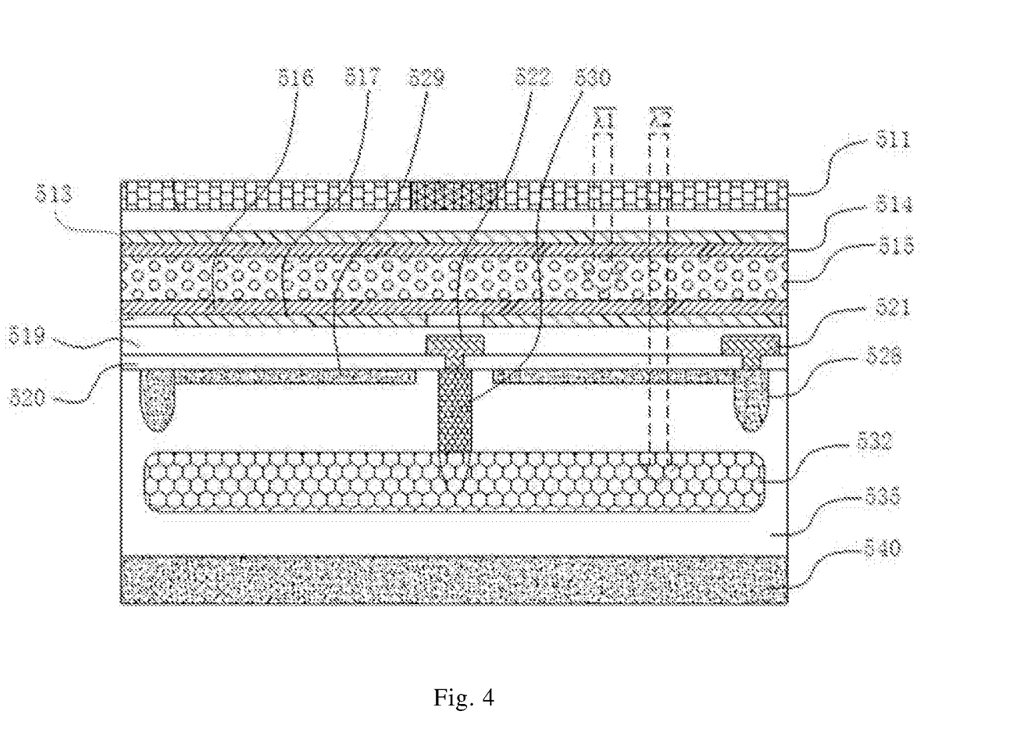
FIG. 4 shows a schematic view of a multispectral imaging device of one embodiment of the present disclosure.

The electrodes in the previous embodiment and so on in the following disclosures, can be realized by heavily doped semiconductor material. As shown in FIG. 4, the P-type heavily doped silicon substrate 540 provides bias voltage to some portions or the whole silicon substrate. A first epitaxial layer 535, lightly doped with P-type dopant, is located above the P-type heavily doped silicon substrate 540. Buried in the epitaxial layer 535 is an ion implanted layer 532, lightly doped with N-type dopant.

As shown in FIG. 4, a contact diffusion 528 and a surface layer 529 are doped with P-type dopant, wherein the contact diffusion 528 servers as contact layer to a metal 521 and channel barrier, the surface layer 529 servers as the third electrode to provide bias to the second photoelectric conversion layer, and in some applications to pin the interface states to reduce detrimental effects of interface traps. A contact diffusion 530 is heavily doped with N-type dopant, servers as contact layer to metal 522.

As shown in FIG. 4, diffusion layer 530 extends into the silicon substrate and reaches the ion implantation area 532, where the photoelectric charges are generated. The photoelectric charges are collected at diffusion layer 530, the corresponding potential changes are applied to the gate of the amplifying transistor (as shown in FIG. 3). During reset period, the photoelectric charges are withdrawn from 530 through metal 522 to the source electrode of the reset transistor (as shown in FIG. 3), and then taken out to external circuit. Periodically performing this reset operation without infrared light, will deplete the N-type carriers in the region 532 and create a potential well, ready for generating photoelectric charges and collecting them temporally.

As shown in FIG. 4, the multispectral imaging module further includes a patterned field oxide layer 520 and a patterned insulating layer 519. The electrode 521 and 522 are covered by the insulating layer 519. Through vias on the field oxide 520, the electrode 521 and 522 contact the diffusion layer 530 and 528, respectively.

As shown in FIG. 4, the first photoelectric conversion module includes a first conducting 513 (transparent in visible light and infrared light), a first charge injection barrier film 514, a first photoelectric conversion layer, a second charge injection barrier film 516 and a second conducting layer 517 (transparent in infrared light). The polarity of the first charge injection barrier 514 is opposite to the polarity of the second charge injection barrier 516. For instance, if the first charge implanted barrier film 514 is configured to block hole injection from the first contacting film 513, then the second charges injection barrier 516 is configured to block electron injection from the second conducting film 517. The charge injection barrier 514 and 516 includes at least one of the following materials or compounds, silicon oxide, silicon nitride, silicon carbide, heavily doped silicon layer, wide bandgap semiconductor materials including zinc indium gallium oxide, zinc oxide, zinc sulfide, zinc selenide and cadmium sulfide. Alternatively, a Schottky barrier formed between the transparent electrode and the photoelectric conversion layer can be used in some embodiments in this disclosure.

The first photoelectric conversion layer 515 includes a hydrogenated amorphous silicon thin film, in 1.5 microns to 2 microns thickness. By such a thickness, more than 80% visible light will be absorbed, and almost no visible light will reach to the second photoelectric conversion layer so to prevent interference between visible light image and infrared image. In some embodiments, the first photoelectric conversion layer includes materials such as, ii-vi compounds, e.g. cadmium telluride (CdTe), amorphous selenium (a-Se), indium-gallium-zinc oxide films (IGZO), zinc telluride, cadmium telluride or their mixed materials and alloys.

In some embodiments, the materials of the first photoelectric conversion include organic photoelectric materials and photodiode made of these organic materials (OPD: organic photodiode). One kind of such organic materials is fullerene and its derivatives, for example Poly 3 Methylthiophene (P3HT) and Phenyl Carbon 61 Butyric acid Methyl (PC61BM). On top of the stack of multilayers shown in FIG. 4, there is a color filter array 511, that allows light in certain spectral bands passing through. When OPD with certain dye series and chemical composition in doping material is used, the OPD will be only sensitive to specific spectral bands, and the color filter array 511 shown in FIG. 4 can be removed.

In this embodiment, the heavily doped surface layer 529 is connected to the second constant potential, servers as an electrostatic shielding between the second conducting layer 517 and the second photoelectric conversion layer 532. When the thickness of the surface layer 529 is less than 250 nm, the absorption of infrared light is negligible and the surface layer 529 is considered as a transparent conducting layer in infrared.

In order to effectively shield the most of the electric field which emits from the second conducting layer 517 and may reach to the second photoelectric conversion layer, the third conducting layer 529 should be large enough to block at least 85% of the overlapping area between the second conducting layer 517 and the second photoelectric conversion layer 532.

Figure 5:
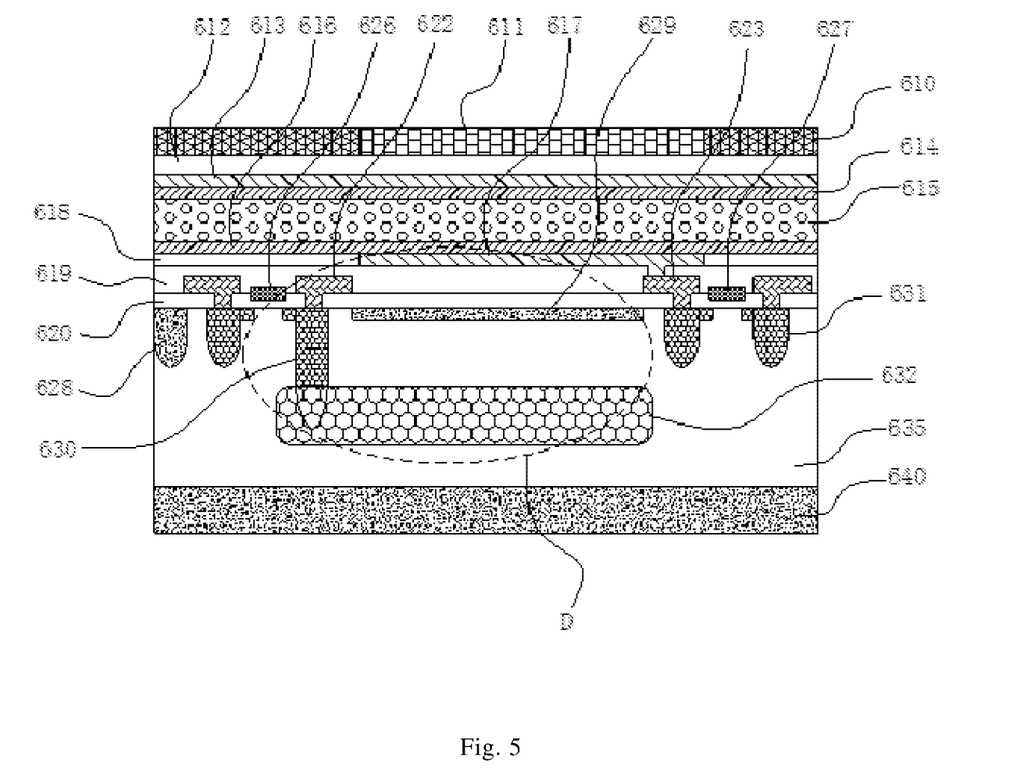
FIG. 5 shows a schematic view of a multispectral imaging device of one embodiment of the present disclosure.

FIG. 5 shows a cross-sectional view of the fifth embodiment of the present disclosure, including a light shield 610, a color filter 611, a passivation film 612, a planarization film 618, an insulating film 619, a field oxide 620, an output electrode 622 of the second photoelectric conversion module, an output electrode 623, a second conducting film 617, the first photoelectric conversion layer 615, a gate electrode 626 of a switch transistor connected to the second photoelectric conversion layer 632, a gate electrode 627 of a switch transistor connected to the first photoelectric conversion module.

The first photoelectric conversion module includes a first conducting film 613, a first charge injection barrier 614, a first photoelectric conversion layer 615, and a second charge injection barrier 616 and a second conducting layer 617. The silicon substrate includes N-type heavily doped diffusion 630 and 631 as sources of the output transistors, a P-type heavily doped channel barrier 628, a P-type heavily doped surface layer 629, an N-type ion implantation layer 632, a P-type epitaxial layers 635, and a P-type heavily doped bottom contact 640 for the silicon substrate.

The thin heavily doped layer 629 is connected to a constant potential or ground, as electric field shielding, to block at least 85% of the overlapping area between the second conducting layer 617 and the second photoelectric conversion layer 632. Therefore, the crosstalk is significantly reduced.

Figure 6:
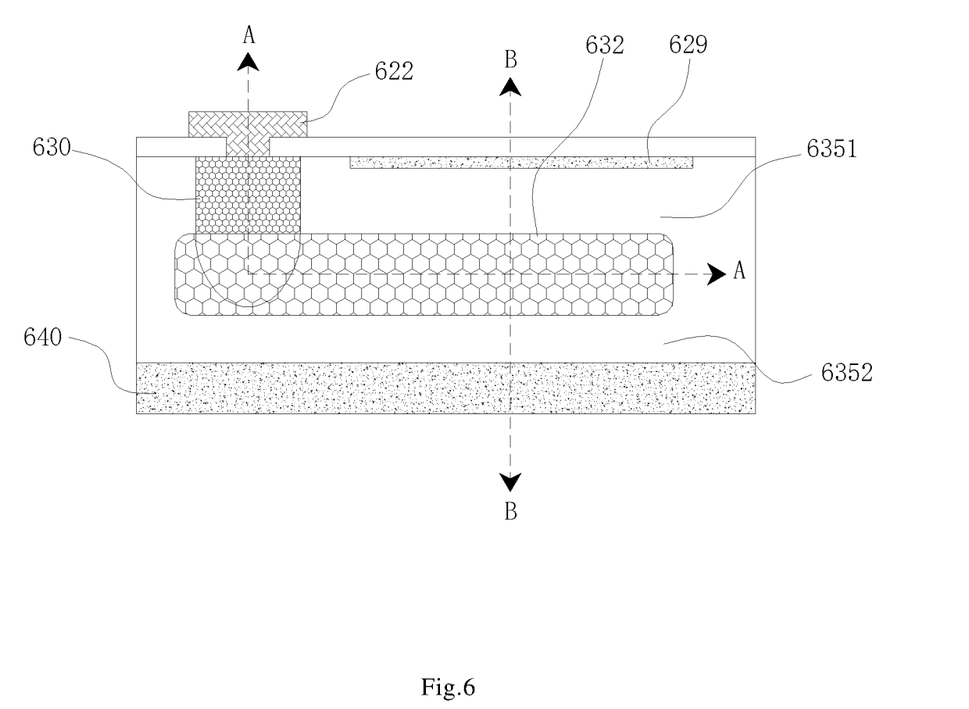
FIG. 6 shows a close-up schematic view of D-portion indicated in FIG. 5.
Figure 7:
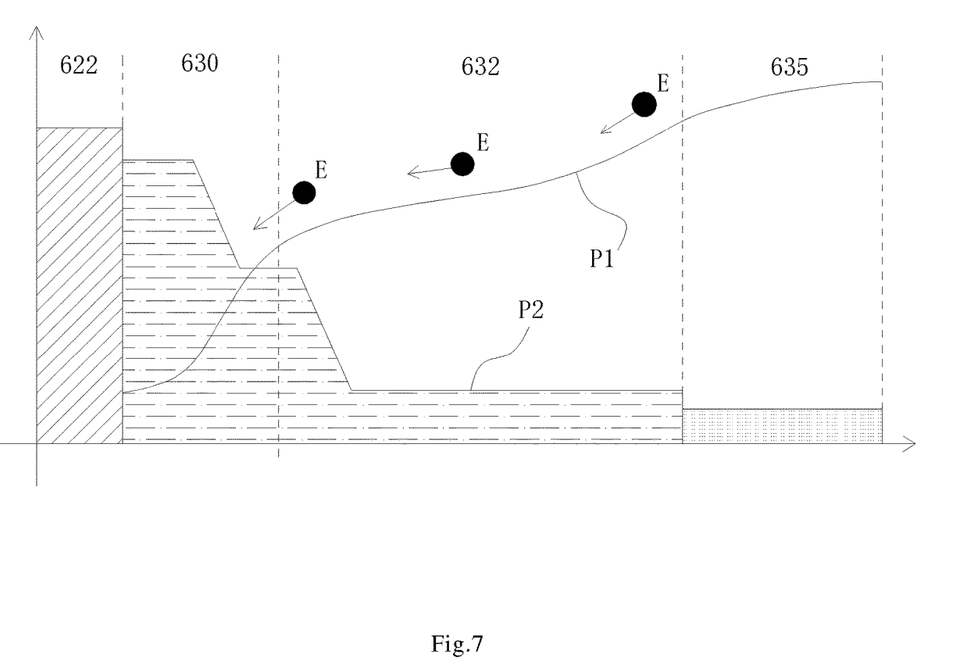
FIG. 7 shows a doping concentration profile and an energy band profile along the cross-section A-A' indicated in FIG. 6, direction of electron drifting on the cross-section A-A' is also illustrated.

FIG. 6 is a close-up of D-portion indicated in FIG. 5, and FIG. 7 is the doping concentration profile and energy band profile along the A-A' line indicated in FIG. 6.

As shown in FIG. 7, outline P2 represents the doping concentration profile, the solid line P1 represents the energy band profile after charge completion. As exhibited in the doping profile, the N-type doping concentration gradually or step by step decreases from region 622 to region 635, and maintains smooth transition region at the border regions. This is critical to build up an internal electric field to drive photoelectric charges toward collecting electrode 622, and avoid potential barrier or "bumper" built up in the drifting path. The energy band profile P1 then demonstrates such an ideal scenario.

Figure 8:
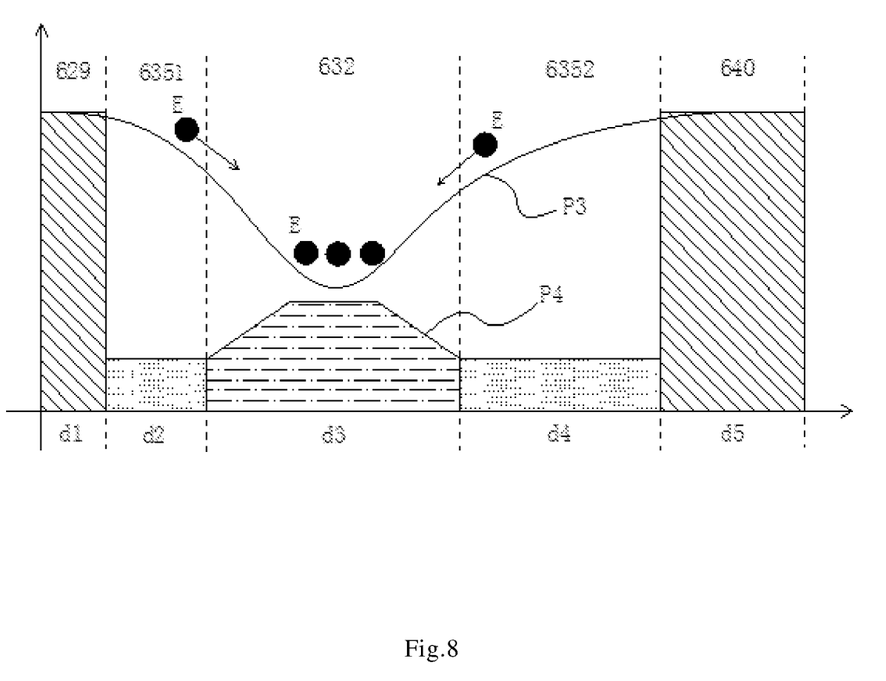
FIG. 8 shows a doping concentration profile and an energy band profile along the cross-section B-B' indicated in FIG. 6, direction of electron drifting on the cross-section B-B' is also illustrated.

FIG. 8 shows doping concentration profile P4 along the B-B' line indicated in FIG. 6, and the energy potential profile P3 after major carrier depleted. The P-type lightly doped epitaxial layer 635 is split by N-type implanted region 632 into two layers, indicated by 6351 and 6352.

The layer 629 and layer 640 are heavily doped and will never be fully depleted. Therefore layer 640 servers as a high conducting layer. Due to the heavily doped layer 629, the interface states are kept in "pinned" status, no trapping or de-trapping dark charges generated from the interface.

Due to the potential gradient P1 shown in FIG. 7, the photo generated charges in layer 632 will quickly drift laterally to the diffusion region 630 and store there. Any potential changes in the first photoelectric conversion layer 615 will not disturb the normal operation of the second photoelectric conversion layer, and wise versa. Two advantages are contributed by this arrangement. First, capacitances in the first and the second photoelectric conversion layers are reduced, resulting in high charge-voltage conversion efficiency in APS pixel circuit. Secondly, the heavily doped layer 629 can be kept in electrically floated, resulting in simple layout and high process yield.

By optimizing the doping concentrations in region 632, 6351 and 6352, the carriers in these three regions are completely depleted, and the potential profile forms a valley shape as shown in FIG. 8. This potential profile provides the largest absorption depth for infrared light, and better photoelectric charge collection efficiency.

To derive the optimum doping concentration profile, for the sake of simplicity, the thickness and doping concentration in each layer is named along light incident direction as, $d_1$ and $N_1$ are thickness and doping concentration of the layer 629, respectively. Similarly, $d_2$ and $N_2$ for the layer 6351, $d_3$ and $N_3$ for the layer 632, $d_4$ and $N_4$ for the layer 6352, $d_5$ and $N_5$ for the layer 640.

First of all, as described above, the layer 629 and the layer 640 are kept highly conductive as conducting electrode. Therefore the following relationships hold, $(d_1 \times N_1 + d_2 \times N_2) > 0.5 \times d_3 \times N_3$ (equation 1), and $(d_5 \times N_5 + d_4 \times N_4) > 0.5 \times d_3 \times N_3$ (equation 2).

Secondly, to form an ideal potential profile as illustrated in FIG. 8, the doping concentrations and thickness should satisfy the following relationships, $d_2 \times N_2 < 0.5 \times d_3 \times N_3$ (equation 3), and $d_4 \times N_4 < 0.5 \times d_3 \times N_3$ (equation 4).

As alternative doping profile, $d_2$ and $d_4$ are close to zero or equal to zero, the N-type ion implanted layer 632 can be simply replaced by an N-type epitaxial layer. However the equation 1 and equation 2 still hold.

Figure 9:
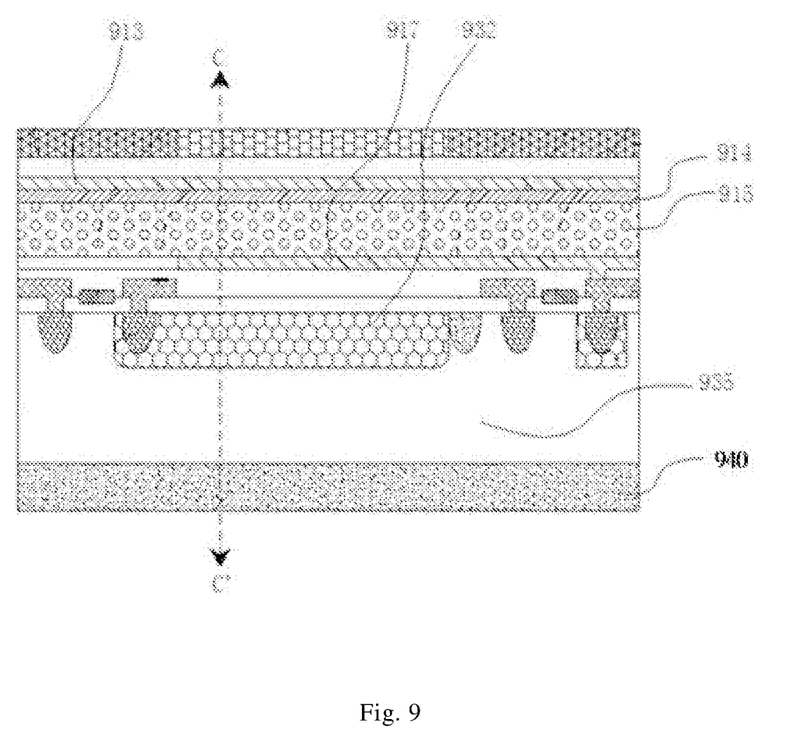
FIG. 9 shows a cross-sectional view of a multispectral imaging device of one embodiment of the present disclosure.
Figure 10:
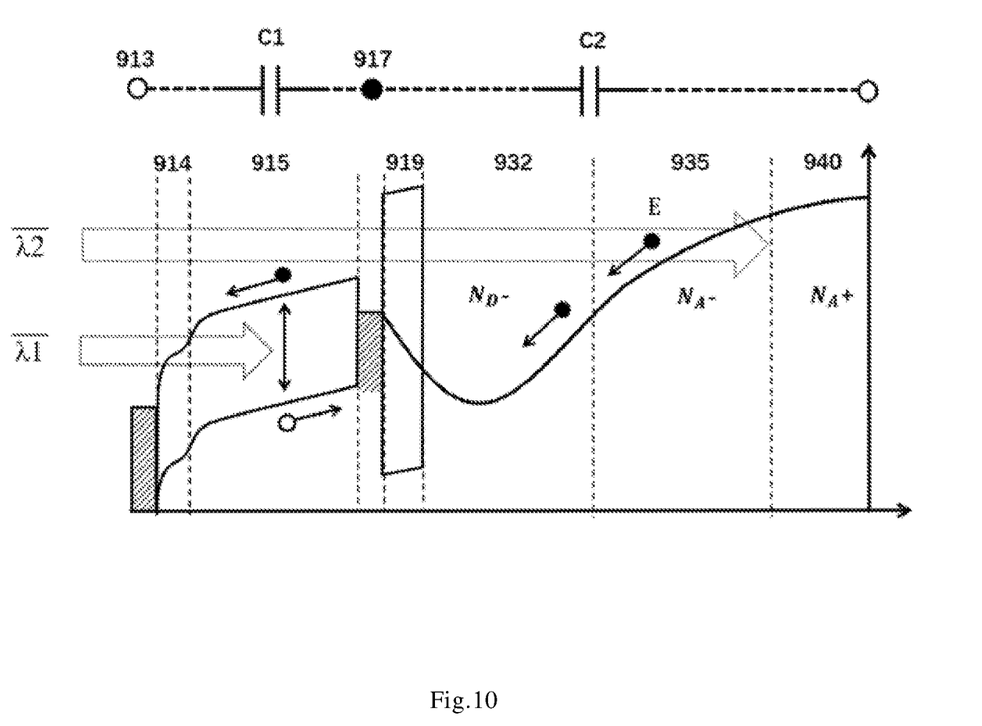
FIG. 10 shows energy band profiles in the first photoelectric conversion layer and the in the second photoelectric conversion layer, along the cross-section C-C' indicated in FIG. 9. The drifting direction of electron is illustrated as well.

FIG. 9 shows a cross-sectional view of a multispectral imaging device of one embodiment of the present disclosure. FIG. 10 is a schematic diagram of the energy band profile along the C-C' line indicated in FIG. 9. For the sake of simplicity, an insulation layer 919 shown in FIG. 10 is equivalent to the two insulation layers between the second electrode 917 and semiconductor photoelectric conversion layer 932 shown in FIG. 9 (619 and 620 in FIG. 5). All the other layers in the stack structure and their definition are similar as the stack structure shown in FIG. 5, except that $d_1=0$, and $d_2=0$. The equation 2 that $(d_5 \times N_5 + d_4 \times N_4) > 0.5 \times d_3 \times N_3$ still hold in this embodiment.

As shown in FIG. 10, the visible light is absorbed by the first photoelectric conversion film 915, while the infrared light passes through multilayer in the first photoelectric conversion module and absorbed by the silicon layers 932 and 935.

As shown in FIG. 9, there is no electrostatic shielding layer between the first photoelectric conversion module and the second photoelectric conversion module. Only the first transparent conducting film 913 and the heavily doped silicon substrate 940 are connected to constant voltages.

This unique arrangement provides two major advantages, higher conversion efficiency for infrared light (without light loss in heavily doped surface layer 629 as shown in FIG. 5), higher conversion efficiency in APS pixel circuit (lower capacitances in both the first and the second photoelectric conversion layers).

Many semiconductor materials, can be used for the first photoelectric conversion film 915, including but not limited to hydrogenated amorphous silicon, zinc selenide (ZnSe), zinc telluride (ZnTe), cadmium telluride (CdTe) or indium telluride (InTe). Organic photoelectric materials such as Poly 3 Methylthiophene (P3HT) and Phenyl Carbon 61 Butyric acid Methyl (PC61BM).

The hole injection barrier 914 can be formed with a combination of an N-type heavily doped semiconductor material and a transparent conductor 913 with high working function. Materials to form the hole injection barrier also include at least one of the followings: zinc oxide (ZnO), zinc sulfide (ZnS), zinc selenide (ZnSe), and cadmium sulfide (CdS). The first transparent conducting film 913, in some embodiments, includes indium tin oxide (ITO) or tin oxide (SnO2).

Figure 11:
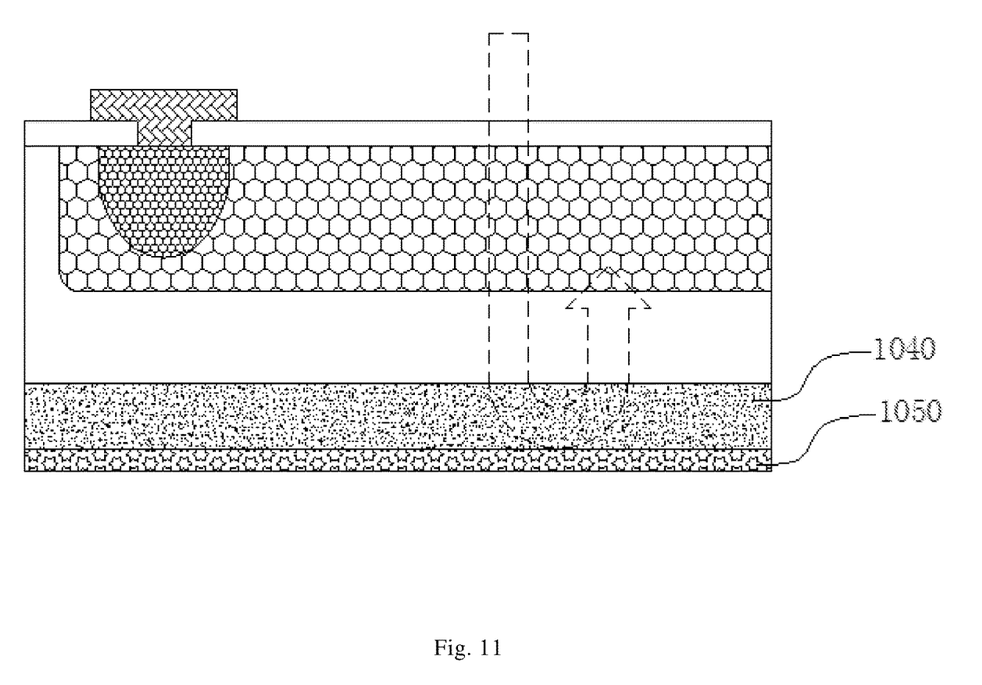
FIG. 11 shows a cross-sectional view of a multispectral imaging device of one embodiment of the present disclosure.

FIG. 11 shows a cross-sectional view of a multispectral imaging device of one embodiment of the present disclosure, where a reflective film 1050 for infrared light is added comparing with previously described structures in FIG. 4, FIG. 5, and FIG. 9. The infrared reflective film is located on the exiting side of the infrared light beam in the second photoelectric conversion module. The infrared light reflective film 1050, as shown in the embodiment of FIG. 11, is overlapped on the P-type heavily doped silicon substrate 1040.

The infrared light reflecting film 1050 includes aluminum or other metallic materials. In some embodiments, a multi-layer infrared reflective film can be applied. Infrared light reflected by the reflective film will return to the second photoelectric conversion layer, then the overall conversion efficiency for infrared light especially those infrared light in longer wavelength is improved.

In summary, the present disclosure described a kind of multispectral imaging device formed on one chip with hybrid semiconductor materials stack. The multispectral imaging device will perform high quality imaging acquisition for both visible light with multiple colors and infrared light with minimized optical and electric cross-talks. The acquisition of visible image in multiple color and infrared image by the multispectral imaging device in the present disclosure can be executed in real time and via one optical lens system and along single optical axes. Multispectral imaging camera or imaging system employed the proposed multispectral imaging device will be realized in compact, light weight, low cost format for various hand held and remote applications.

What is claimed is:

1. A multispectral imaging device comprising an array of imaging pixel, wherein each imaging pixel comprises:
    a first photoelectric conversion module further comprising:
        a first photoelectric conversion layer located between a first conducting layer and a second conducting layer, wherein the first conducting layer, coupled to a first constant potential, is configured to allow visible light and infrared light to pass through, the first photoelectric conversion layer is configured to convert the visible light into a first electrical signal, and the second conducting layer, coupled to a first pixel circuit, is configured to allow the infrared light to pass through;
    a second photoelectric conversion module, formed in a silicon substrate, configured to receive the infrared light passing through the first photoelectric conversion module, and the second photoelectric conversion module further comprising:
        a second photoelectric conversion layer located between a third conducting layer and a fourth conducting layer, wherein the third conducting layer is configured to allow the infrared light to pass through, the second photoelectric conversion layer is configured to convert the infrared light into a second electrical signal;
        a second pixel circuit coupled to the second photoelectric conversion module or the fourth conducting layer;
    wherein each of the first pixel circuit and the second pixel circuit includes an amplifying circuit, wherein the amplifying circuit comprises at least three MOS transistors including a reset transistor switch, an amplifying transistor and an output transistor switch;
    wherein the third conducting layer is coupled to a second constant potential or kept electrically floating, and the fourth conducting layer is coupled to a third constant potential.

2. The multispectral imaging device of claim 1, wherein the third conducting layer is silicon having thickness of $d_1$, and doped with a first type dopant in a doping concentration of $N_1$;
    wherein the second photoelectric conversion layer further includes:
        a first silicon epitaxial layer having a thickness of $d_2$, and doped with the first type dopant in a doping concentration of $N_2$;
        an ion implanted silicon layer having a thickness of $d_3$, and doped with a second type dopant in a doping concentration of $N_3$;
        a second silicon epitaxial layer having a thickness of $d_4$, and doped with the first type dopant in a doping concentration of $N_4$; and
    wherein the fourth conducting silicon layer is having a thickness of $d_5$, and doped with the first type dopant in a doping concentration of $N_5$; and
    wherein the thicknesses and the dopant concentrations are related to each other by the formula of $(d_1 \times N_1 + d_2 \times N_2) > 0.5 \times d_3 \times N_3$ and $(d_5 \times N_5 + d_4 \times N_4) > 0.5 \times d_3 \times N_3$.

3. The multispectral imaging device of claim 2, wherein the second photoelectric conversion layer further includes multiple patterned and heavily doped diffusion areas doped with either the first type dopant or the second type dopant, for the purposes of CMOS transistor source or drain contacts, or for channel stops to prevent signal cross-talk and dark current, and wherein at least one of the multiple patterned and heavily doped diffusion areas that is heavily doped with the second type dopant is extended into the ion implanted silicon layer.

4. The multispectral imaging device of claim 1, wherein the second photoelectric conversion layer further includes:
    a first silicon epitaxial layer having a thickness of $d_2$, and doped with a first type dopant in a doping concentration of $N_2$;
    an ion implanted silicon layer having a thickness of $d_3$, and doped with a second type dopant in a doping concentration of $N_3$;
    a second silicon epitaxial layer having a thickness of $d_4$, and doped with the first type dopant in a doping concentration of $N_4$;

wherein the thicknesses and the dopant concentrations are related to each other such that at least one of the two formulas $d_2 \times N_2 < 0.5 \times d_3 \times N_3$ and $d_4 \times N_4 < 0.5 \times d_3 \times N_3$, is satisfied.

5. The multispectral imaging device of claim 1, wherein the second photoelectric conversion layer further includes:
an ion implanted silicon layer having a thickness of $d_3$, and doped with a second type dopant in a doping concentration of $N_3$;
a second silicon epitaxial layer having a thickness of $d_4$, and doped with a first type dopant in a doping concentration of $N_4$;
the fourth conducting silicon layer having a thickness of $d_5$, and doped with the first type dopant in a doping concentration of $N_5$;
wherein the thicknesses and the dopant concentrations are related to each other by the formula of $(d_5 \times N_5 + d_4 \times N_4) > 0.5 \times d_3 \times N_3$.

6. The multispectral imaging device of claim 3, wherein a doping concentration of the at least one of the multiple patterned and heavily doped diffusion areas that is heavily doped with the second type dopant gradually or stepwise decreases vertically from its metal contact surface toward the ion implanted silicon layer; and wherein a doping concentration of the ion implanted silicon layer gradually or stepwise decreases laterally from an extension of the at least one of the multiple patterned and heavily doped diffusion areas towards the far end of the ion implanted silicon layer.

7. The multispectral imaging device of claim 1, wherein the third conducting layer is configured with its area and location, to block at least 85% of the overlapping area between the second conducting layer and the second photoelectric conversion layer.

8. The multispectral imaging device of claim 1, wherein the first photoelectric conversion module further includes a first charge injection barrier formed between the first conducting layer and the first photoelectric conversion layer, and a second charge injection barrier formed between the first photoelectric conversion layer and the second conducting layer.

9. The multispectral imaging device of claim 1, wherein the first photoelectric conversion layer includes at least one of the following materials: amorphous silicon, amorphous selenium, cadmium telluride, lead oxide, organic photoelectric conversion materials such as Poly3 Methylthiophene (P3MT) or Phenyl Carbon 61 Butyric acid Methyl (PC61BM).

10. The multispectral imaging device of claim 1 further includes an infrared reflecting film configured to reflect the infrared light that penetrates through the second photoelectric conversion layer.

* * * * *